United States Patent [19]
Watanabe

[11] Patent Number: 6,137,744
[45] Date of Patent: Oct. 24, 2000

[54] MEMORY DEVICE WITH REDUCED POWER CONSUMPTION

[75] Inventor: Jun Watanabe, Kasugai, Japan

[73] Assignee: Fujitsu Limited, Kawasaki, Japan

[21] Appl. No.: 09/459,650

[22] Filed: Dec. 13, 1999

[30] Foreign Application Priority Data

Dec. 14, 1998 [JP] Japan .................................. 10-354057

[51] Int. Cl.⁷ .................................................. G11C 7/00
[52] U.S. Cl. ...................................... 365/227; 365/230.08
[58] Field of Search ..................................... 365/226, 227, 365/230.08, 233, 189.05

[56] References Cited

U.S. PATENT DOCUMENTS

| | | | |
|---|---|---|---|
| 5,300,831 | 4/1994 | Pham et al. ................................ | 326/44 |
| 5,812,000 | 9/1998 | Kobayashi et al. ..................... | 327/172 |
| 5,889,709 | 3/1999 | Fukuda ................................ | 365/189.05 |
| 5,973,529 | 10/1999 | Chappell et al. ....................... | 327/200 |

*Primary Examiner*—Son Mai
*Attorney, Agent, or Firm*—Arent Fox Kintner Plotkin & Kahn, PLLC

[57] ABSTRACT

A memory device, such as a SDRAM, has an active mode and a standby mode. A memory core is controlled in the active state and the standby state. First and second latch circuits respectively latch a data signal and a command signal, when clocked. In the active state, a buffer circuit connected to the first latch circuit, latches the latched data signal, and generates a buffered data signal. A register is connected to the buffer and receives and stores the buffered data signal. A decision circuit, connected between the second latch circuit and the buffer circuit, decodes the latched command signal and selectively activates the buffer circuit based on the decoded command. In the standby mode, the latched data signal is not provided to the buffer circuit. Power may also not be provided to the buffer circuit in the standby mode.

13 Claims, 7 Drawing Sheets

MEMORY DEVICE WITH REDUCED POWER CONSUMPTION

BACKGROUND OF THE INVENTION

The present invention relates to a memory device which stores data in a storage unit such as a register, other than a memory cell core, in a standby mode.

Some memory devices are configured to reduce power consumption they are not in use.

FIG. 1 is a diagram of a conventional memory device 300. The memory device 300 includes a core unit 301 and a peripheral unit 302. The core unit includes memory cells. The peripheral unit 302 performs input and output with an external device (not shown). The core unit 301 is controlled to perform only the holding operation (for example, self refresh operation for a DRAM) of storage information when entering a standby state (power saving state). In the standby state, power is not supplied to the peripheral unit 302 other than a decision unit 303 which issues a return to an active state command. When the decision unit 303 issues the return command, the core unit 301 and the peripheral unit 302 return to the active state.

As shown in FIG. 2, the peripheral unit 302 includes a terminal 310, a peripheral circuit 311 (input/output circuits), and a register 312. The register 312 is a storage device other than the memory cells of the core unit 301. The register 312 stores information when the core unit 301 is in the standby state. The information stored in the register 312, for example, indicates the operation after the core unit 301 has returned to the active state and is typically a special mode register set (SMRS) used in a graphics memory.

However, when the memory is a synchronous memory, such as a synchronous dynamic random access memory (SDRAM), an accurate value cannot be stored in a register because all of the units except the decision unit 303 enter the standby state.

A synchronous memory device latches a signal provided to each input terminal in synchronism with a clock signal ck as shown in FIG. 3 even if it is in the standby state. Therefore, the register 312 of the peripheral unit 302 can latch input data after a period i during which the decision unit 303 determines a command has elapsed in the case where the latch circuit of the decision unit 303 always operates and the latch circuit of the peripheral unit 302 enters the standby state.

However, as shown in FIG. 3, the latch time does not guarantee that valid data is available. Accordingly, the register 312 fails to store the correct data. This problem occurs particularly when the logic process is performed by a plurality of logic stages to determine a command (the period i is long). Therefore, the entire peripheral unit 302 must always be made to enter the active state for the synchronous memory device when the register 312 stores information and the core unit 301 is in the standby state. This increases the power consumption of the peripheral unit 302 regardless of the active/standby state of the core unit 301.

SUMMARY OF THE INVENTION

It is an object of the present invention to provide a memory device that reduces the power consumption of a peripheral unit thereof.

In one aspect of the present invention, a memory device including a memory core unit having an operation mode including an active state and a standby state is provided. A first latch circuit latches a data signal in accordance with a clock signal and generates a latched data signal. A second latch circuit latches a command signal in accordance with a clock signal and generates a latched command signal. A buffer circuit receives the latched data signal from the first latch circuit and generates a buffered data signal in the active state. A register is connected to the buffer circuit and stores the buffered data signal. A decision circuit decodes the latched command signal and selectively activates the buffer circuit when the memory core unit is in the standby state, based on the decoded latched command signal.

In another aspect of the present invention, a memory device having an active state and a standby state is provided. A first latch circuit is connected to an input terminal and latches a data signal. A plurality of second latch circuits latch a plurality of command signals. A decoder receives the latched command signals and generates a decoder output signal in accordance with the latched command signals. A gate circuit receives the decoder output signal and an active/standby signal and generates an enable signal. A buffer circuit selectively receives the latched data signal in accordance with the enable signal. A delay circuit receives and delays the decoder output signal and generates a delayed enable signal. A register latches an output thereof in accordance with the delayed enable signal. The buffer circuit receives the latched data signal and provides the latched data signal to the register in accordance with the enable signal when the memory device is in the standby state.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

FIG. 7b is a wave form chart of one-shot pulse signals applied to the latch circuit of FIG. 7a;

DETAILED DESCRIPTION OF THE PREFERRED EMBODIMENTS

Figure 1:
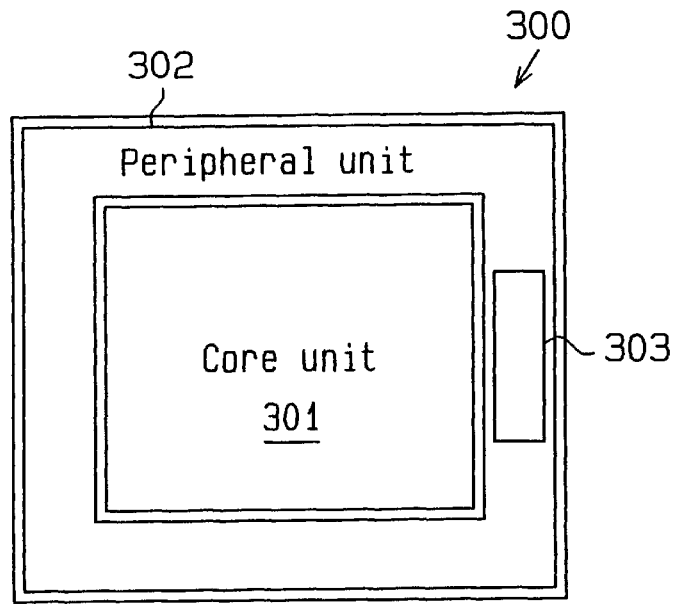
FIG. 1 is a schematic block diagram of a conventional memory device.
Figure 2:
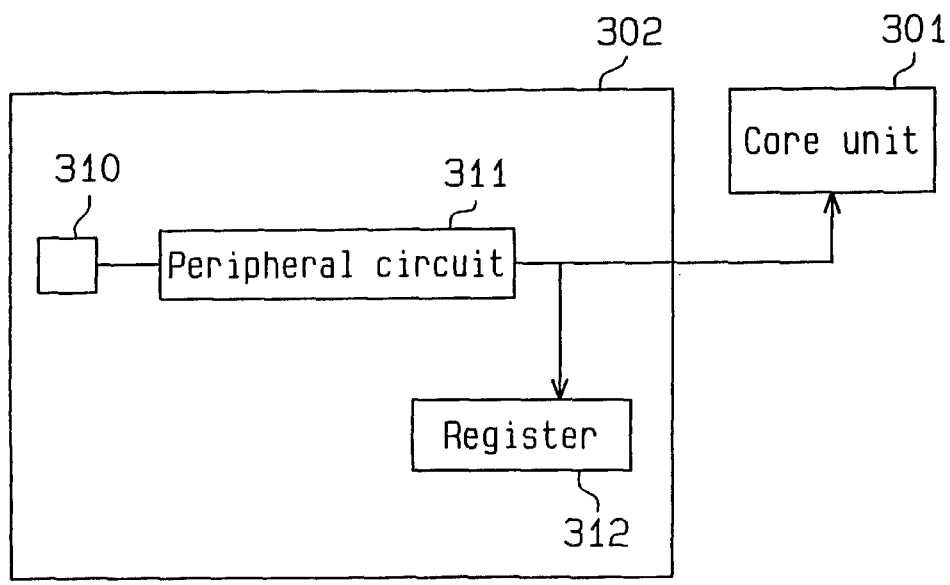
FIG. 2 is a schematic block diagram of a peripheral unit of the memory device of FIG. 1.
Figure 3:
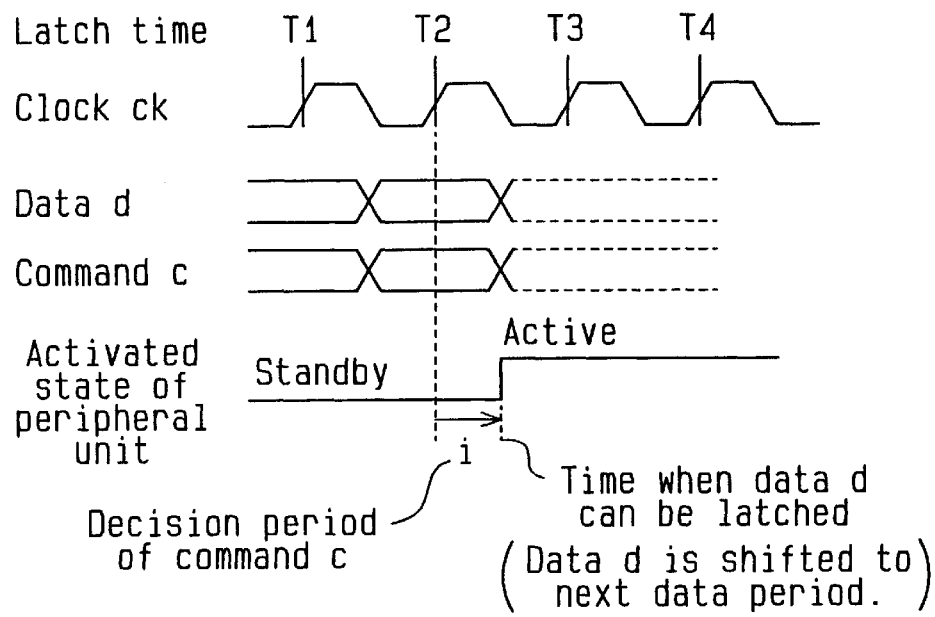
FIG. 3 is a timing chart for describing the operation of the memory device of FIG. 1.
Figure 4:
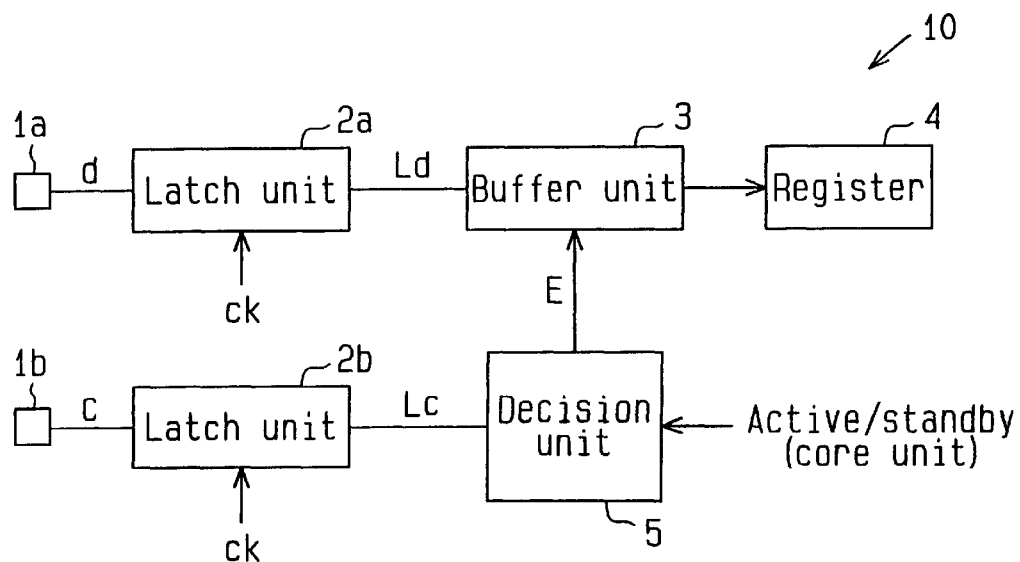
FIG. 4 is a schematic block diagram of a memory device according to a first embodiment of the present invention.

FIG. 4 is a schematic block diagram of a memory device 10 of a first embodiment of the present invention. The memory device 10 includes two latch units 2a, 2b, a buffer unit 3, a register 4 and a decision unit 5.

The first latch unit 2a latches data d input to a data input terminal 1a in accordance with a synchronous clock signal ck. The latch unit 2b latches a command c input to a command input terminal 1b in accordance with the synchronous clock signal ck. The register 4 stores input data, such as operation mode data. The decision unit 5 causes the buffer unit 3 to enter the standby state when a core unit (not shown) is in the standby state. The decision unit 5 also decodes the latched command, determines whether the command is an activation instruction for a register write (data write instruction to a register or instruction which activates a register write circuit), and causes the buffer unit 3 to enter the active state, even if the core unit is in the standby state, based on the decoded command.

Figure 5:
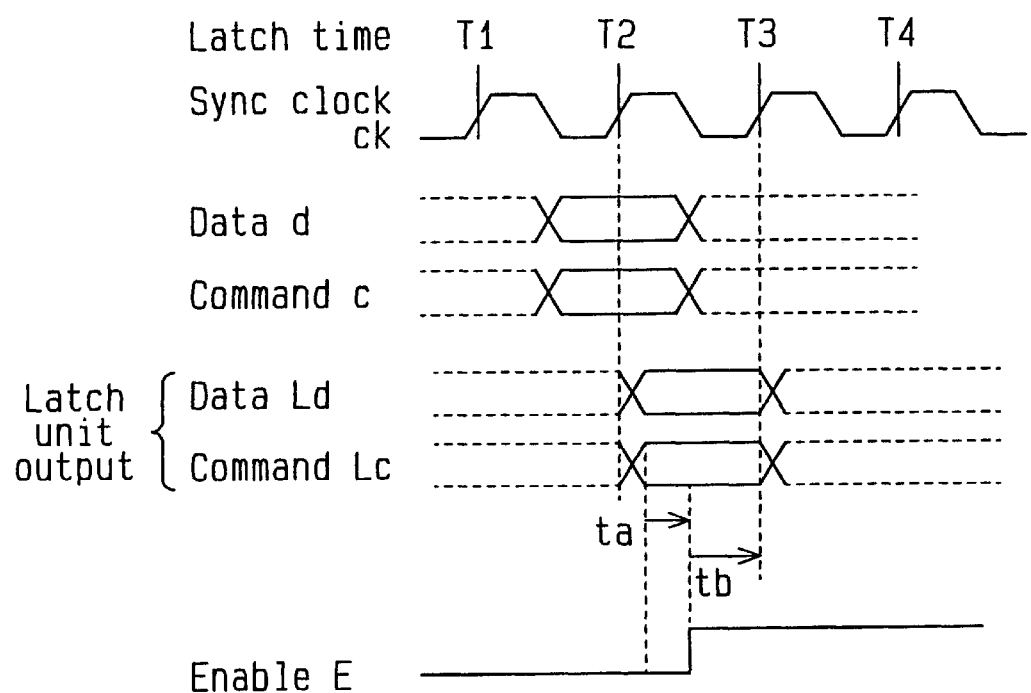
FIG. 5 is a timing chart for describing the operation of the memory device of FIG. 4.

FIG. 5 is a wave chart for describing an operation of the memory device 10 of FIG. 4. In FIG. 5, the core unit is in the standby state and the buffer unit 3 is controlled in the standby state by the decision unit 5 at a latch time T1. The core unit of the present invention is provided with at least one memory cell array and performs holding an operation when in the standby state.

The data d and the command c are latched by the latch units 2a, 2b each latch time T1–T4 in accordance with the synchronous clock ck, respectively. The latched data Ld and the latched command Lc are held until the next latch time.

The case where the command Lc latched at the latch time T2 is an activation instruction (e.g. a write instruction to the register 4) will now be described. First, the decision unit 5 decodes the latched command Lc at a time ta. When the decision unit 5 determines that the latched command Lc is an activation instruction, the decision unit 5 provides an enable signal E to the buffer unit 3 at a time tb.

At the time tb, although the previous data period has now elapsed at the data input terminal 1a, the latch circuit 2a holds the previous input data until the next latch time T3. Therefore, the buffer unit 3 can receive the data latched at the time T2 and provide the latched data Ld to the register 4 even though the buffer unit 3 is activated after the time tb.

The buffer unit 3 receives the valid data Ld even after a command has been determined and the buffer unit 3 is active/standby-controlled by the decision unit 5, thereby reducing power consumption. In the standby state, the buffer unit 3 is controlled by the decision unit 5, and does not receive input data Ld and provide output data. In the standby state, the buffer circuit 3 could also hold the latched data not to perform driving a load and power to the buffer unit 3 could be inhibited.

The buffer unit 3 preferably has a flip-flop configuration, for example, and an input buffer function can be employed. The register 4 stores the operation mode when the core unit returns to the active state.

The present invention can be used with a synchronous type dynamic random access memory.

Figure 6:
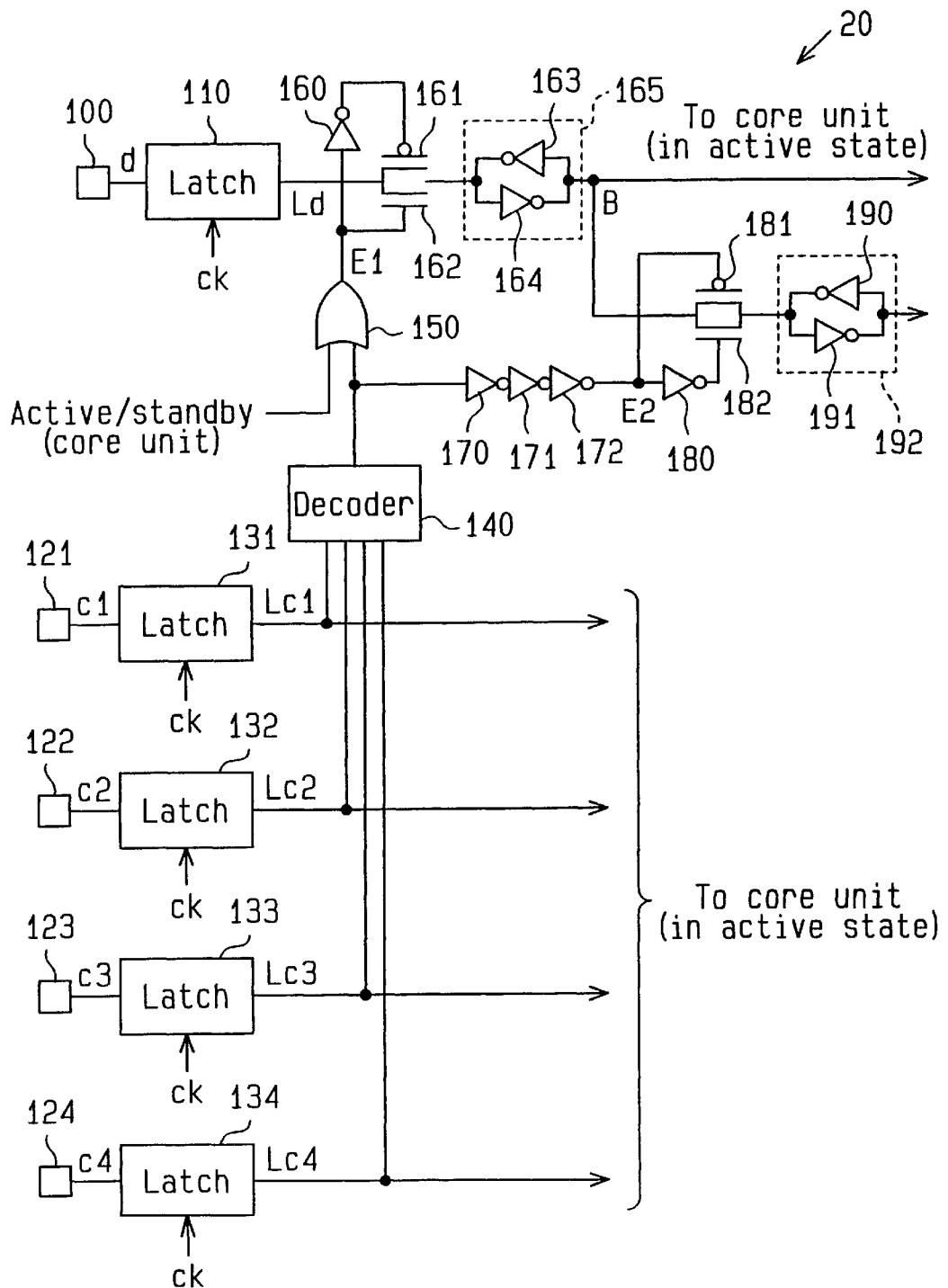
FIG. 6 is a schematic diagram of a memory device according to a second embodiment of the present invention.

FIG. 6 is a diagram of a memory device 20 according to a second embodiment of the present invention. The memory device 20 includes latch circuits 110, 131, 132, 133 and 134, a buffer circuit 165, a decoder 140, an OR circuit 150 and a register 192.

The latch circuit 110 latches data d input to a data input terminal 100 and outputs a latched data signal Ld. The latch circuits 131 to 134 latch commands c1 to c4 input to command input terminals 121 to 124, respectively and output latched command signals Lc1–Lc4. An electrostatic protection circuit or a level converter (not shown) may be provided between the input terminals 100 and 121 to 124 and the latch circuits 110 and 131 to 134.

The decoder 140 is connected to the latch circuits 131–134, decodes a command and generates a command detection signal. The OR circuit 150 receives the command detection signal from the decoder 140 and an active/standby signal provided from the core unit (not shown) and generates an enable signal E1.

An enhancement type p-channel transistor 161 is made conductive or nonconductive by the enable signal E1 provided from the OR circuit 150 via an inverter 160. An enhancement type n-channel transistor 162 is made conductive or nonconductive by the enable signal E1.

The buffer circuit 165 includes inverters 163, 164 which are connected to each other. The buffer circuit 165 functions as an input buffer of the register 192 when the core unit is in the standby state and as an input buffer of the core unit when the core unit is in the active state.

Series connected inverters 170 to 172 delay the command detection signal from the decoder 140 and generate an enable signal E2.

An enhancement type p-channel transistor 181 is made conductive or nonconductive by the enable signal E2. An enhancement type n-channel transistor 182 is made conductive or nonconductive by the enable signal E2 inverted by an inverter 180.

The register 192 includes inverters 190, 191 which are connected to each other and the transistors 181, 182. The register 192 output signal is provided to a circuit (e.g., an instruction decoder) which references the information stored in the register 192.

Figure 7A:
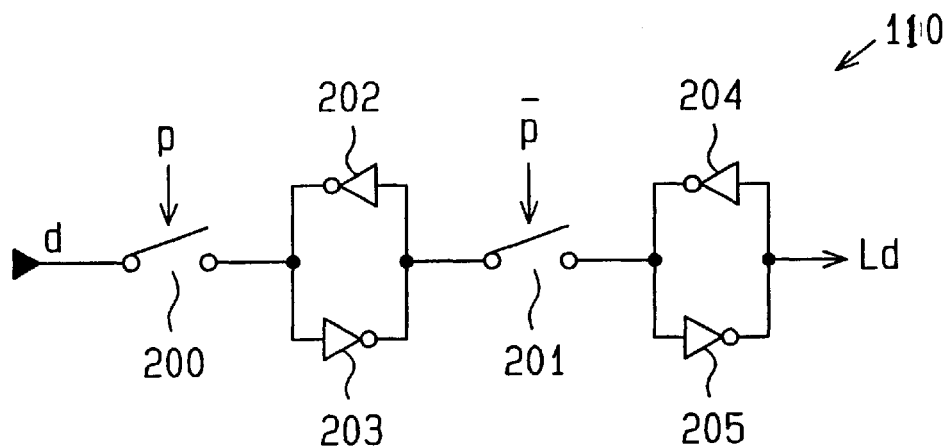
FIG. 7a is a schematic diagram of a latch circuit of the memory device of FIG. 6.
Figure 7B:
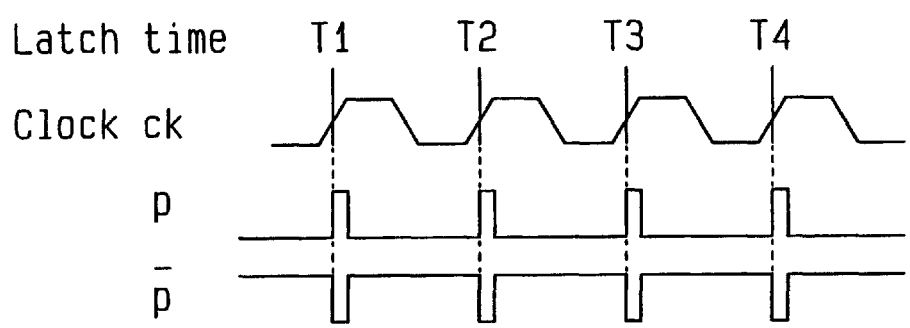

FIG. 7a is a diagram of the latch circuit 110. The latch circuits 131–134 preferably have the same construction. The latch circuit 110 includes switches 200 and 201, and inverters 202, 203, 204 and 205. The inverters 202, 203 and the inverters 204, 205 each form flip-flops. The switches 200 and 201 are complementarily opened or closed by one-shot pulse signals P and /P generated in accordance with the latch times T1 to T4, as shown in FIG. 7b. The latch 110 input signal d is sampled and held by the flip-flop comprising the inverters 202, 203 when the switch 200 is closed and the switch 201 is opened. The flip-flop comprising the inverters 204 and 205 prevents the output of the latch circuit 110 from floating.

Figure 8:
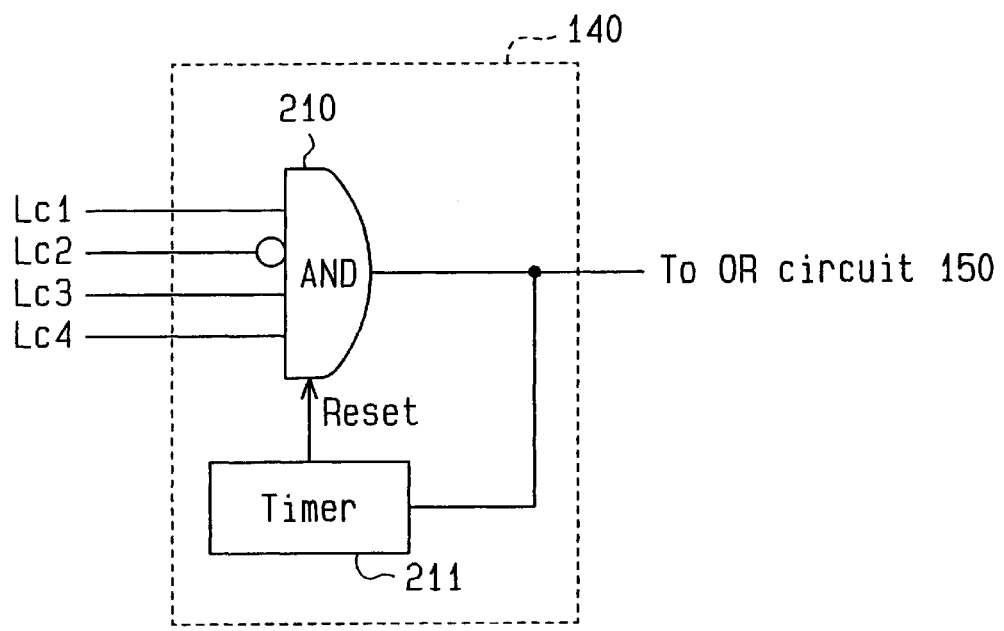
FIG. 8 is a schematic diagram of a decoder of the memory device of FIG. 6.

FIG. 8 is a schematic diagram of the decoder 140. The decoder 140 includes a four-input AND circuit 210 and a timer 211. The timer 211 receives the AND circuit 210 output signal and resets the AND circuit 210 after a predetermined output period has elapsed.

The decoder 140 detects a register write command when latch outputs Lc1, Lc3 and Lc4 are a logic high level H and latch output Lc2 is a logic L and generates a command detection signal having the logic H. The latch output Lc2 is inverted before it is input to the AND circuit 210. After an output period has been counted by the timer 211, the output of the decoder 140 is reset to the logic low level L.

Figure 9:
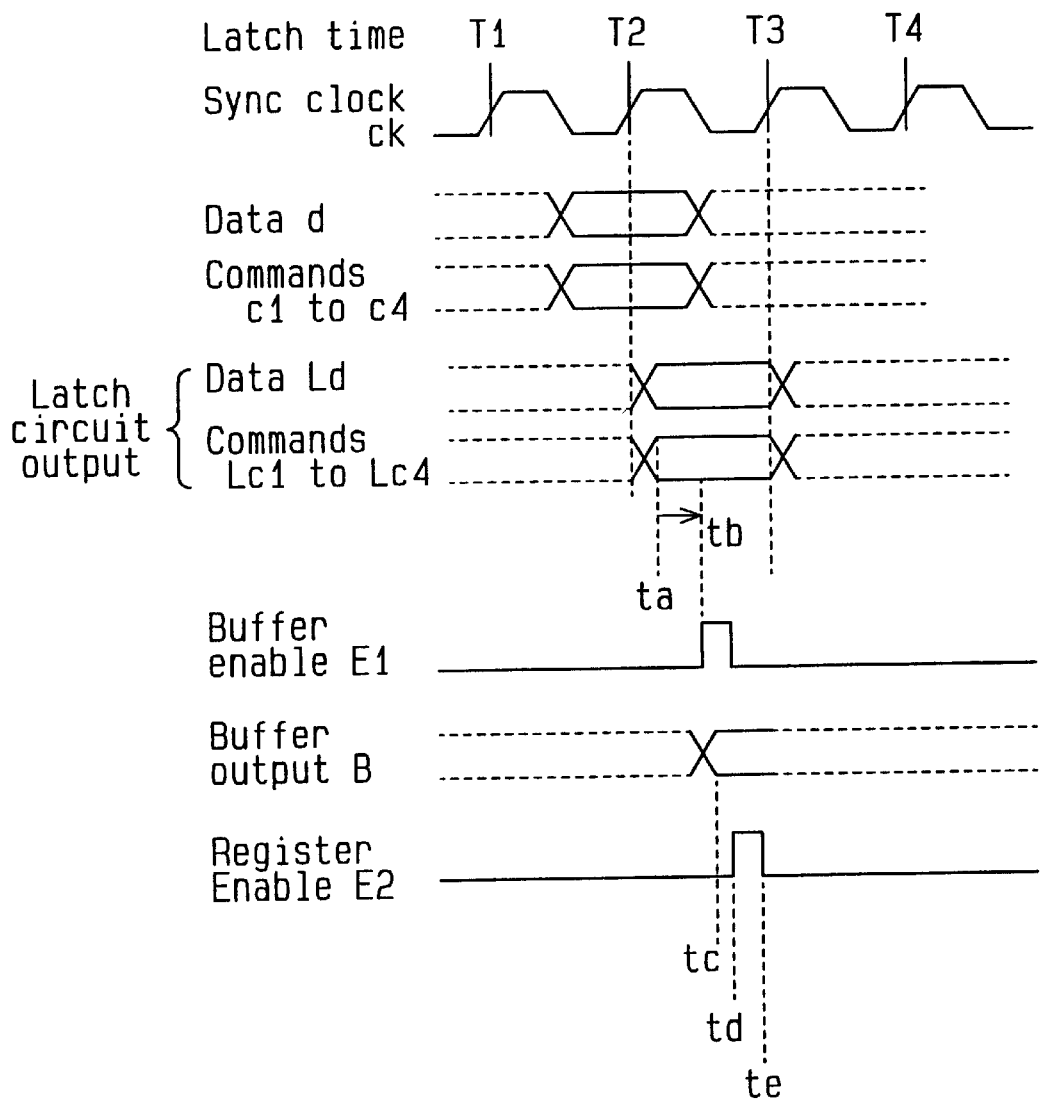
FIG. 9 is a timing chart for describing the operation of the memory device of FIG. 6.

The operation of the memory device 20 when the core unit is in the standby state is described below based on the timing chart shown in FIG. 9. In the second embodiment, the input terminals 100 and 121 to 124 are not provided for data and a command exclusively but function as input terminals of an address and data when the core unit is in the active state.

In FIGS. 6–9, ck indicates a synchronous clock signal, T1 to T4 indicate latch times, d indicates a data signal input to the terminal 100, c1 to c4 indicate command signals input to the terminals 121 to 124, Ld indicates the output signal of the latch circuit 110, Lc1 to Lc4 indicate the output signals of the latch circuits 131 to 134, E1 indicates a buffer enable signal, E2 indicates a register enable signal and B indicates the output signal of the buffer 165.

At the time prior to the latch time T1, the command signals c1 to c4 have not get been detected as commands and the decoder 140 outputs the command detection signal low. The OR circuit 150 outputs a signal low because the core unit is in the standby state (the active/standby signal is low). Accordingly, the transistors 161 and 162 are nonconductive and a signal change is not generated at the input of the buffer circuit 165. Therefore, even if an input change occurs at the data input terminal 100 before the latch time T1, the output buffer 165 is not activated and the output signal of the buffer circuit 165 does not change. That is, the buffer circuit 165 is maintained in the standby state. In general, if no signal change occurs at the output, a stationary current is consumed, and accordingly, power consumption is very low. In particular, if the buffer circuit 165 comprises a CMOS circuit, power consumption is even lower since the CMOS circuit will not drive the output.

Next, the case where the commands c1 to c4, latched at the latch time T2, are register write commands is described.

First, the data d and the commands c1 to c4 are latched at the latch time T2 and the latch circuits 110 and 131 to 134 output the latch outputs Ld and Lc1 to Lc4 at time ta. The latch circuits 110 and 131 to 134 hold the latch outputs Ld and Lc1 to Lc4 until the next latch time T3.

The decoder 140 decodes the latch outputs Lc1 to Lc4, detects that the latch outputs are a register write command, and provides a high command detection signal. The OR circuit 150 receives the high command detection signal from the decoder 140 and outputs a high buffer enable signal E1 at time tb. At this time, although the validity period of the input data d, latched at the latch time T2, has elapsed and the data value of the data input terminal 100 is indefinite, the latch circuit 110 still holds the data latched at the latch time T2. Accordingly, the transistors 161, 162 are made conductive by the buffer enable signal E1 and the data latched at the latch time T2 is transferred to the buffer circuit 165. The buffer circuit 165 receives the latch output signal Ld and outputs the buffer output signal B at time tc (the active state of the buffer circuit 165).

The buffer enable signal E1 is set to the logic L level after the output period of the decoder 140 has elapsed at time td. That is, after the timer 211 resets the AND circuit 210. Then, the buffer circuit 165 is re-separated from the latch output signal Ld and returns to the standby state.

The command detection signal output from the decoder 140 is also provided to inverters 170 to 172 (the delay circuit) and the register enable signal E2 is output therefrom at a time td. The transistors 181 and 182 made conductive by the register enable signal E2 high and the register 192 samples the buffer circuit 165 output signal B. Then, after the output period of the decoder 140 has elapsed at a time te, the transistors 181 and 182 are made nonconductive by the register enable signal E2 going low and now the register 192 hold the buffer output signal B. Thus, the data signal d input at the latch time T2 is stored in the register 192.

As described above, according to the second embodiment, even if active/standby control is performed in the same manner as a core unit for the buffer circuit 165, the correct data is stored in the register 192 and the power consumption of the core unit in the standby state is not increased.

It should be apparent to those skilled in the art that the present invention may be embodied in many other specific forms without departing from the spirit or scope of the invention. Particularly, it should be understood that the invention may be embodied in the following forms.

The buffer circuit 165 may also be a logical processing circuit. It is important that the buffer circuit 145 is provided between the latch circuit 110 and the register 192.

The standby state of the buffer circuit 165 may be set as follows:

1) preventing an input change from being transferred to the buffer circuit to suppress the increase of power consumption by the output drive as described in the second embodiment;
2) fixing the logical state in the buffer circuit (or holding latched data) using a latch circuit to prevent the buffer output from being changed even if the input of the buffer circuit is changed; and
3) separating the buffer circuit from a power supply. These standby methods greatly reduce the power consumption when the buffer circuit 165 comprises a CMOS circuit.

Therefore, the present examples and embodiments are to be considered as illustrative and not restrictive and the invention is not to be limited to the details given herein, but may be modified within the scope and equivalence of the appended claims.

What is claimed is:

1. A memory device, comprising:
   a memory core unit having an operation mode including an active state and a standby state;
   a first latch circuit for latching a data signal in accordance with a clock signal and generating a latched data signal;
   a second latch circuit for latching a command signal in accordance with a clock signal and generating a latched command signal;
   a buffer circuit for receiving the latched data signal from the first latch circuit and generating a buffered data signal in the active state;
   a register connected to the buffer circuit for storing the buffered data signal; and
   a decision circuit connected to the second latch circuit for decoding the latched command signal and selectively activating the buffer circuit when the memory core unit is in the standby state, based on the decoded latched command signal.

2. The memory device of claim 1, wherein the decision circuit activates the buffer circuit when the latched command signal is a register set command.

3. The memory device of claim 1, wherein in the standby state, the latched data signal is inhibited from being transferred to the buffer circuit.

4. The memory device of claim 1, wherein the standby state, the latched data is maintained.

5. The memory device of claim 1, wherein in the standby state, power is not supplied to the buffer circuit.

6. The memory device of claim 1, wherein the buffer circuit includes a flip-flop circuit.

7. The memory device of claim 1, wherein the data signal includes a memory device operation mode signal.

8. The memory device of claim 1, wherein the memory device includes a synchronous type dynamic random access memory device.

9. A memory device having an active state and a standby state, comprising:
   a first latch circuit connected to an input terminal for latching a data signal;
   a plurality of second latch circuits, each connected to an input terminal, for latching a plurality of command signals;

a decoder connected to the plurality of second latch circuits for receiving the latched command signals and generating a decoder output signal in accordance with the latched command signals;

a gate circuit for receiving the decoder output signal and an active/standby signal and generating an enable signal;

a buffer circuit connected to the first latch circuit for selectively receiving the latched data signal in accordance with the enable signal;

a delay circuit connected to the decoder for receiving and delaying the decoder output signal and generating a delayed enable signal;

a register connected to the buffer circuit for latching an output thereof in accordance with the delayed enable signal, wherein the buffer circuit receives the latched data signal and provides the latched data signal to the register in accordance with the enable signal when the memory device is in the standby state.

10. The memory device of claim 9, wherein the decoder comprises:

an AND gate for receiving each of the latched command signals and generating an output signal; and a timer connected to the AND gate for receiving the AND gate output signal and generating a reset signal after a predetermined time has elapsed, wherein the AND gate receives the reset signal and the AND gate output signal is reset in response to the reset signal.

11. The memory device of claim 10, wherein the AND gate output signal goes low in response the reset signal.

12. The memory device of claim 9, wherein the first latch circuit comprises:

first and second inverters, wherein the output of the first inverter is connected the input of the second inverter and the output of the second inverter is connected to the input of the first inverter;

third and fourth inverters, wherein the output of the third inverter is connected the input of the fourth inverter and the output of the fourth inverter is connected to the input of the third inverter;

a first switch connected between the input terminal and a node between the output of the second inverter and the input of the first inverter; and a second switch connected between the output of the first inverter and the input of the third inverter, wherein the latch circuit output is generated from a node between the output of the third inverter and the input of the fourth inverter.

13. The memory of claim 12, wherein the plurality of second latch circuits each have the same structure as the first latch circuit.

* * * * *